United States Patent
Hayasaka

(10) Patent No.: US 8,421,492 B2
(45) Date of Patent: Apr. 16, 2013

(54) PROBE CARD AND METHOD FOR SELECTING THE SAME

(75) Inventor: Kazuhito Hayasaka, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 14 days.

(21) Appl. No.: 12/470,597

(22) Filed: May 22, 2009

(65) Prior Publication Data
US 2009/0289650 A1  Nov. 26, 2009

(30) Foreign Application Priority Data
May 22, 2008  (JP) ................... 2008-134590

(51) Int. Cl.
*G01R 31/00* (2006.01)

(52) U.S. Cl.
USPC ............. 324/756.03; 324/754.03; 324/754.12

(58) Field of Classification Search .. 324/750.1–750.03, 324/754.01–754.2, 755.01–755.11, 756.01–756.07
See application file for complete search history.

(56) References Cited

U.S. PATENT DOCUMENTS

| | | | | |
|---|---|---|---|---|
| 4,904,935 A * | 2/1990 | Calma et al. | ............ | 324/756.03 |
| 5,124,646 A * | 6/1992 | Shiraishi | .............. | 324/756.03 |
| 7,049,837 B2 * | 5/2006 | Kasukabe et al. | ........ | 324/754.07 |
| 7,372,286 B2 * | 5/2008 | Lee et al. | ................. | 324/754.18 |
| 7,474,111 B2 * | 1/2009 | Narita | ....................... | 324/756.03 |
| 2006/0220666 A1 * | 10/2006 | Kazama | ........................ | 324/754 |
| 2008/0122466 A1 * | 5/2008 | Miyagi et al. | ................. | 324/754 |
| 2008/0143366 A1 * | 6/2008 | Kurotori et al. | ............... | 324/761 |
| 2009/0219042 A1 * | 9/2009 | Sasaki et al. | .................. | 324/754 |

FOREIGN PATENT DOCUMENTS

| | | |
|---|---|---|
| JP | 2001-021583 | 1/2001 |
| JP | 2004-144742 | 5/2004 |

OTHER PUBLICATIONS

Kazutaka Honda, et al, "A 14b Low-power Pipeline A/D Converter Using a Pre-charging Technique," IEEE Symposium on VLSI Circuits Digest of Technical Papers, pp. 196-197, 2007.

* cited by examiner

*Primary Examiner* — Arleen M Vazquez
(74) *Attorney, Agent, or Firm* — Turocy & Watson, LLP

(57) ABSTRACT

A probe card includes a probe unit having multiple through holes arranged therein, multiple probe needles respectively press-fitted to the multiple through holes, a printed board having convex portions which presses down the probe needles located in predetermined positions, and a unit holder which supports the probe unit and the printed board.

9 Claims, 20 Drawing Sheets

※···REPEATING UNITS

※···REPEATING UNITS

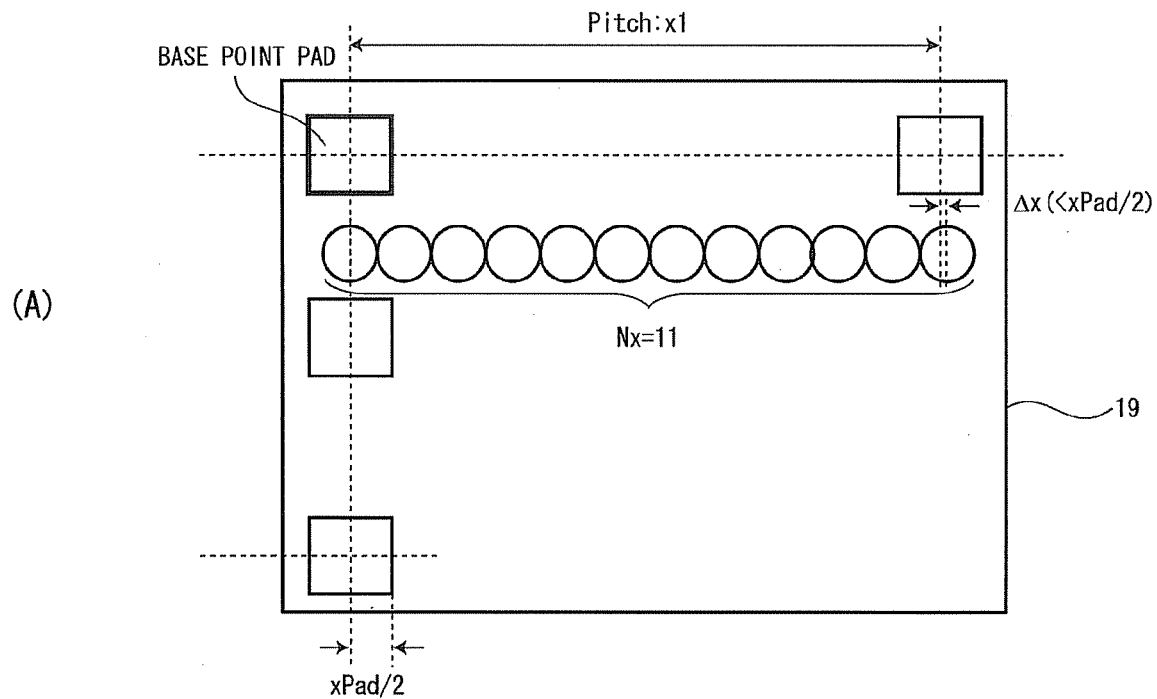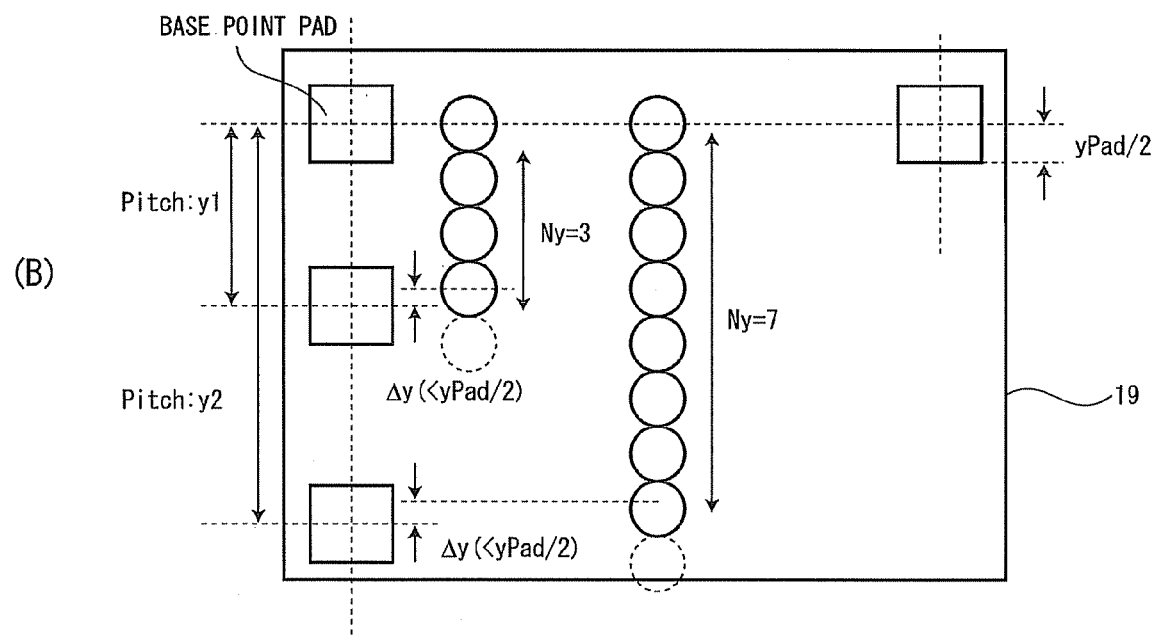
Fig. 11

PROBE CARD AND METHOD FOR SELECTING THE SAME

CROSS-REFERENCE TO RELATED APPLICATIONS

This application is based upon and claims the benefit of priority from prior Japanese Patent Application No. 2008-134590, filed May 22, 2007, the entire contents of which are incorporated herein by reference.

FIELD OF THE INVENTION

The present invention relates to a test apparatus for semiconductor devices. For example, the present invention relates to a probe card and method for selecting the same.

DESCRIPTION OF THE RELATED ART

In a conventional wafer testing process for semiconductor devices, probe cards need to be developed with different specifications for products of semiconductor devices and fabricated so as to match positions of bonding pads, chip sizes, and other features of the corresponding products.

Thus, every time a new product is developed, a probe card for the new product is newly fabricated with different specifications. This requires a fabrication of a housing part dedicated to the new product, which involves huge initial costs. Moreover, an increase in size of the wafers in recent years leads to an increase in time required for fabricating the housing unit.

SUMMARY

According to one aspect of the present invention, there is provided a probe card comprising: a probe unit having a plurality of through holes arranged therein; a plurality of probe needles respectively press-fitted to the plurality of through holes; a printed board having a convex portion which presses down any of the probe needles located in a predetermined position; and a unit holder which supports the probe unit and the printed board.

According to another aspect of the present invention, there is provided a probe card comprising: a probe unit having a plurality of through holes arranged therein; a plurality of probe needles respectively press-fitted to the plurality of through holes; a printed board electrically connected to the probe needles; and a contact mask having an aperture in a region thereof corresponding to any of the probe needles located in a predetermined position.

According to another aspect of the present invention, there is provided a method for selecting a probe card comprising: inputting pad coordinates P (x, y) of a test target chip; inputting pad sizes (xPad, yPad) of the test target chip; calculating the number of x-direction pad pitches counted from a base point pad of the test target chip; calculating the number of y-direction pad pitches counted from the base point pad of the test target chip; calculating an x-direction pitch difference dx=(the number of through hole pitches of a currently selected probe card×Nx)−(the number of x-direction pad pitches counted from a base point pad), where Nx is an integer starting from 1; judging whether or not the x-direction pitch difference dx is below 0; incrementing the Nx value when the x-direction pitch difference dx is not less than 0, and calculating the x-direction pitch difference dx again; judging, when the x-direction pitch difference dx is below 0, whether or not a minimum value of an absolute value of the x-direction pitch difference dx is not more than xPad/2, the x-direction pitch difference dx obtained by a calculation based on the Nx value; calculating a y-direction pitch difference dy=(the number of through hole pitches of a currently selected probe card×Ny)−(the number of y-direction pad pitches counted from the base point pad); judging whether or not the y-direction pitch difference dy is below 0; incrementing the Ny value when the y-direction pitch difference dy is not less than 0, and calculating the y-direction pitch difference dy again; judging, when the y-direction pitch difference dy is below 0, whether or not a minimum value of an absolute value of the y-direction pitch difference dy is not more than yPad/2, the y-direction pitch difference dy obtained by a calculation based on the Ny value; and selecting a different probe card when the minimum value of the absolute value of the x-direction pitch difference dx is judged to be more than xPad/2 or when the minimum value of the absolute value of the y-direction pitch difference dy is judged to be more than yPad/2.

According to another aspect of the present invention, there is provided a method for selecting a probe card comprising: inputting pad coordinates P (x, y) of a test target chip; expanding the pad coordinates P (x, y) of the test target chip to coordinates of all pads in all test target chips located on a wafer surface; calculating a difference dx between an x coordinate of a P-th pad on the wafer surface and an x coordinate of a TH-th through hole on the wafer surface; calculating a difference dy between a y coordinate of the P-th pad on the wafer surface and a y coordinate of the TH-th through hole on the wafer surface; judging whether or not the through hole TH currently being calculated is a last through hole THn in a probe card; incrementing a value TH when the through hole TH currently being calculated is judged not to be the last through hole THn in the probe card, and calculating dx and dy again; judging, when the through hole TH currently being calculated is judged to be the last through hole THn in the probe card, whether or not a pad P currently being calculated is a last pad Pn on the wafer surface; when the pad P currently being calculated is judged to be the last pad Pn on the wafer surface, obtaining a value dx of a minimum absolute value (dxmin) from among all the pads on the test target chips on the wafer surface; obtaining a value dy of a minimum absolute value (dymin) from among all the pads on the test target chips on the wafer surface; judging whether or not dxmin obtained for each of the pads is not more than xPad/2 and dymin obtained for each of the pads is not more than yPad/2, where the xPad and the yPad are pad sizes of the test target chip; and selecting a different probe card when dxmin is judged to be more than xPad/2 and when dymin is judged to be more than yPad/2.

BRIEF DESCRIPTION OF THE DRAWINGS

FIGS. 11A and 11B are plan views of a device which the probe unit according to the third embodiment of the present invention measures.

DETAILED DESCRIPTION OF THE EXEMPLARY EMBODIMENTS

Comparative Example

Figure 13:
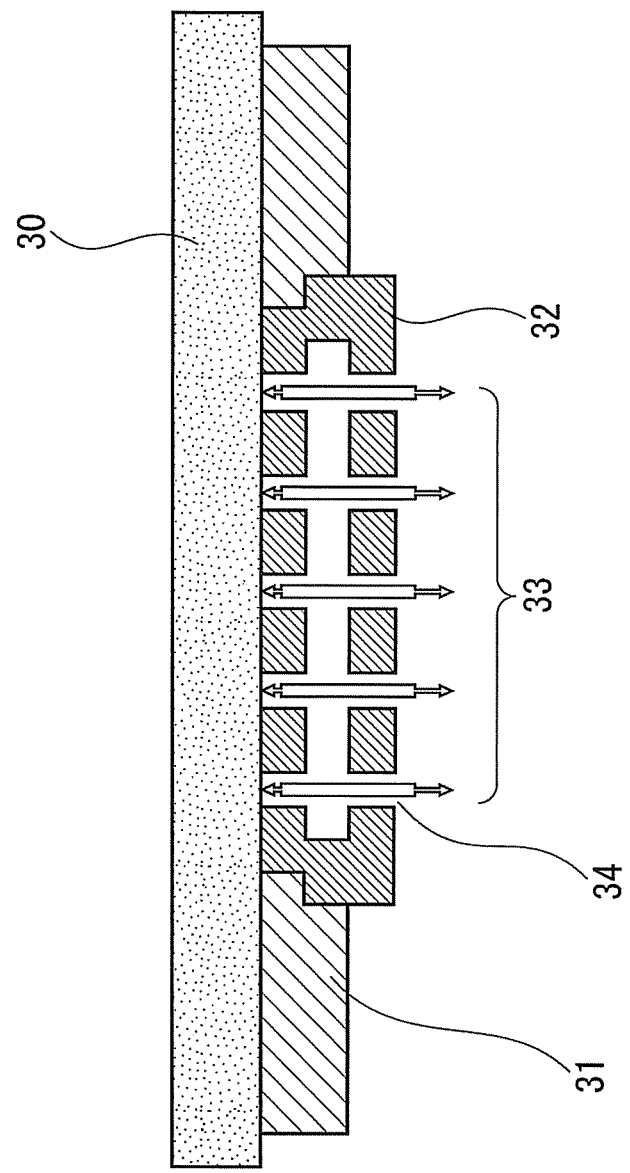
FIG. 13 is a cross-sectional view of a probe unit according to a comparative example to the present invention.

FIG. 13 is a cross-sectional view schematically showing a probe card 300 according to a comparative example. The probe card 300 includes a printed board 30, a unit holder 31, a probe unit 32, and multiple probe needles 33. In a conventional wafer testing process, all these components have been newly developed for each product. The probe unit 32 is usually provided with through holes 34 only in positions corresponding to a pad layout of the product, each of the through holes 34 allowing the probe needle 33 to be inserted therein. Accordingly, the probe unit 32 has a difficulty to flexibly deal with a case where a device to be measured is changed to another one.

Figure 14:
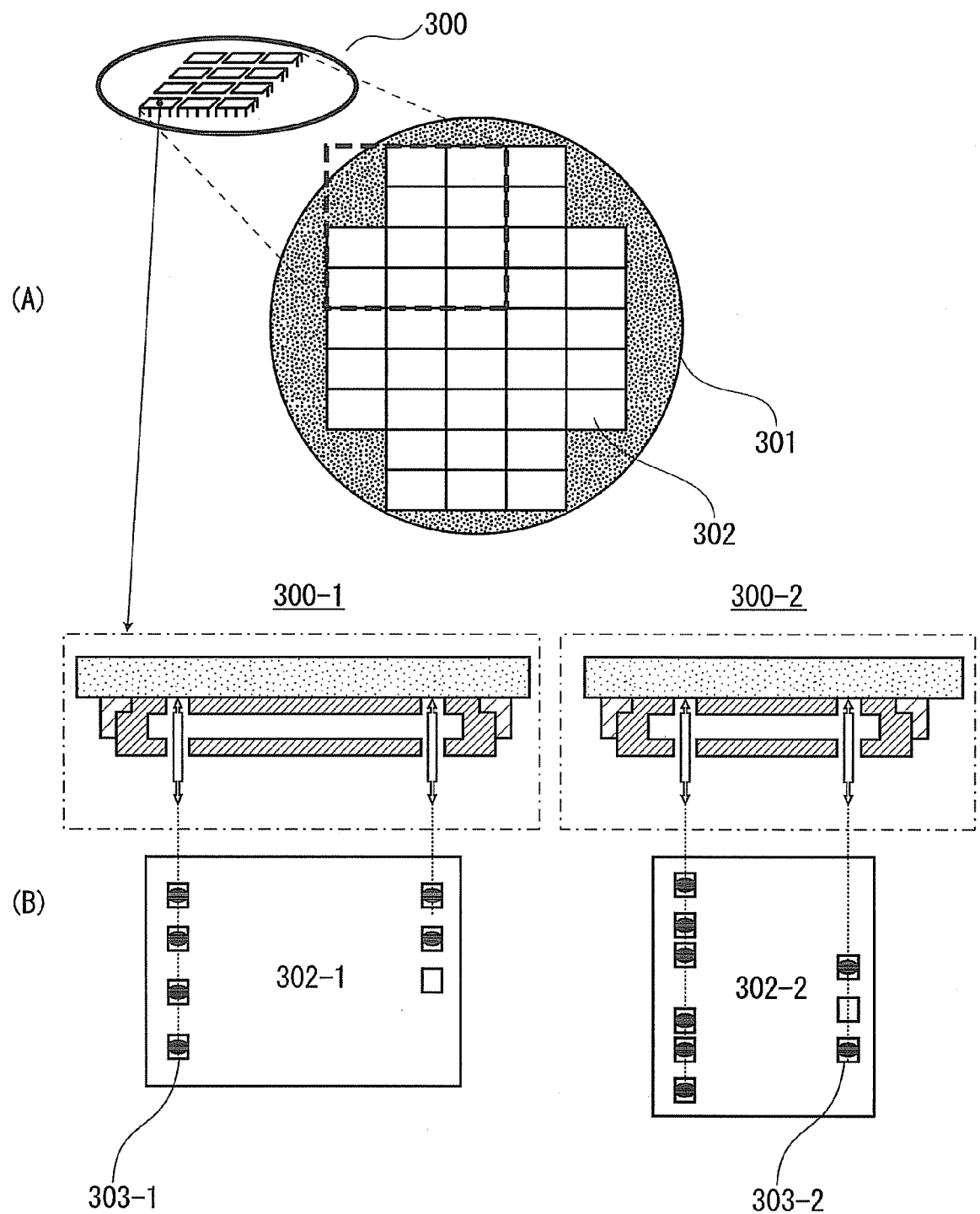
FIG. 14A is a plan view of a wafer and FIG. 14B is a cross-sectional view of chips and probe cards according to the comparative example to the present invention.

FIG. 14A is a top plan view of a wafer and FIG. 14B is an enlarged view of chips, which are provided for conceptually explaining different probe cards are respectively needed for devices to be measured that have different chip sizes and different layouts of bonding pads. As shown in FIG. 14A, multiple devices to be measured (test target chips) 302 are disposed on a wafer 301. The probe card 300 is configured to be able to collectively be in contact with a predetermined number (such as 12 pieces) of chips Here, a chip 302-1 and a chip 302-2 are assumed as the test target chips as shown in FIG. 14B. The chip 302-1 and the chip 302-2 have different chip sizes, and layouts of bonding pads 303-1 and bonding pads 303-2 are also different. Accordingly, it is not possible to carry out tests for both of the chips by using a single probe card. For this reason, the chip 302-1 requires a probe card 300-1 adaptable to the chip 302-1, and the chip 302-2 requires a probe card 300-2 adaptable to the chip 302-2.

Meanwhile, Japanese Patent Application Laid-Open Publication No. 2001-21583 discloses a conventional structure in which common through holes are made in advance in standard lattice positions on a bottom lid provided with pin wiring, and springs and plungers are inserted in predetermined positions based on a wafer pattern so as to form a probe needle modules.

This conventional structure makes it possible to reuse the pin modules, but requires providing the pin wiring corresponding to all the through holes in advance. Therefore, this structure can hardly deal with narrow pitches. Moreover, this structure requires selecting the positions that require the springs and the plungers before inserting the pins one by one thereto, thereby providing poor efficiency. Further, this conventional structure lacks any disclosure concerning a method for selecting the predetermined positions into which the springs and the plungers are inserted based on a pattern of a test target wafer.

A probe card according to a first embodiment of the present invention, which is made to address the aforementioned problems observed by the inventor of the present invention, will be described below with reference to the accompanying drawings.

First Embodiment

A structure of a probe card according to a first embodiment will be described with reference to FIG. 1A to FIG. 5. The structure of the probe card of this embodiment will be shown throughout FIG. 1A to FIG. 5 in accordance with the order of assembly processes thereof.

FIG. 1A is a plan view showing a probe unit 10 constituting a probe card 100 according to the first embodiment of the present invention and FIG. 1B is a cross-sectional view of the probe unit shown in FIG. 1A, which is taken along an A1-A2 line (a diametrical direction).

The probe unit 10 according to this embodiment is supported by a unit holder 11, and numerous through holes (circular through holes) 12 are formed on an entire surface of the probe unit 10 corresponding to a contact area. The probe unit 10 is formed of a material such as a ceramic, but may be formed of other insulative materials. Meanwhile, the unit holder 11 is formed of a material such as stainless steel, but may be formed of other metallic materials.

The probe unit 10 is formed into a circular shape, for example, and configured to have a diameter larger than a wafer (having a diameter of 200 mm or 300 mm, for example) having multiple devices to be measured provided on a principal surface thereof, and to allow so-called full-wafer contact. Probe needles 13 are press-fitted to all the through holes 12 in advance. The shape of each through hole 12 does not always have to be circular but may be of any other shapes as long as the through holes 12 allow the probe needles 13 to be press-fitted thereinto, and can hold the probe needles 13. In order to simplify the description, FIG. 1A illustrates the probe needle 13 only inside the enlarged through hole 12.

While FIG. 1A shows the case where the through holes 12 are laid out in square lattice positions, the layout of the through holes 12 is not limited only to this configuration. Meanwhile, each of the through holes 12 may be formed in a minimum processable size and the interval between the through holes 12 may be defined as a minimum pitch considering a processing margin. Alternatively, it is also possible to apply a larger size or a wider pitch when appropriate. Here, layout variations of the through holes 12 will be explained in detail in an embodiment to be described later.

Figure 2:
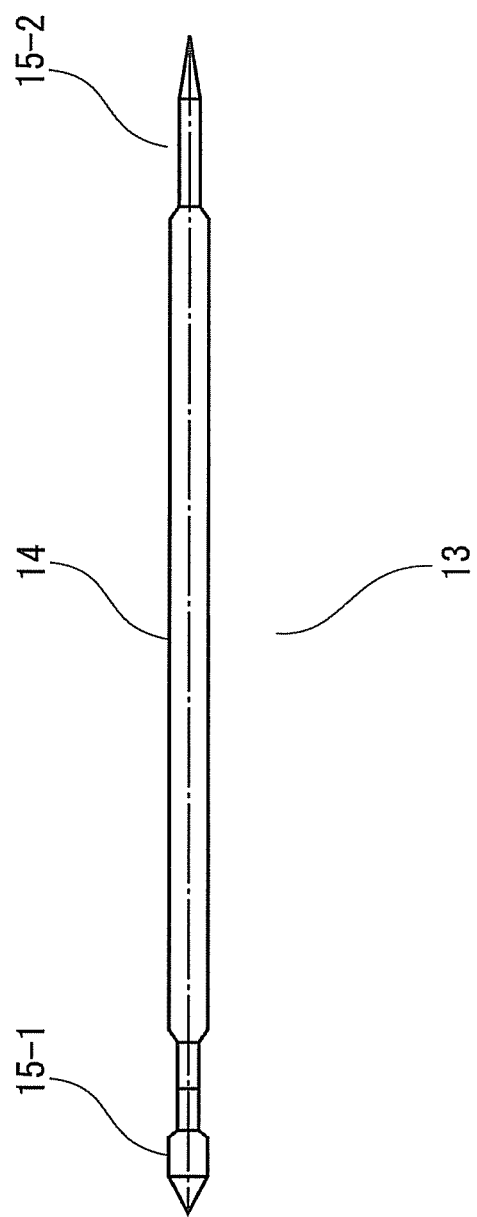
FIG. 2 is a schematic diagram showing a configuration of a probe needle according to the first embodiment of the present invention.

Each of the probe needles 13 is a spring probe and has a structure as shown in FIG. 2, for example. FIG. 2 is a schematic diagram showing a configuration of the probe needle 13 according to this embodiment. The probe needle 13 holds a plunger 15-1 and a plunger 15-2 against a direction of compression by use of a spring housed inside a barrel 14. The probe needle 13 has a total length of 2.2 mm, and a spring coefficient k is set to k=0.03 gf/μm, for example. Needle points of the plunger 15-1 and the plunger 15-2 are formed of Au, Pt, Pd or W, for example.

Figure 3:
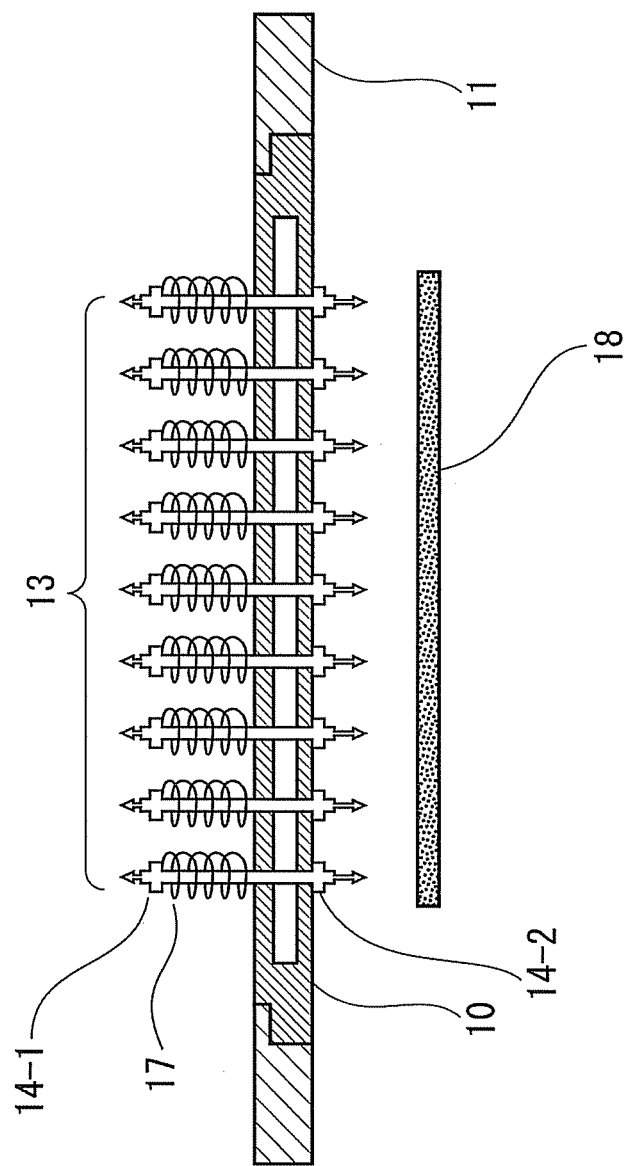
FIG. 3 is another cross-sectional view of the probe unit according to the first embodiment of the present invention.

Here, provided is a mechanism which can pull and support the probe needles 13 upward (in a receding direction from the principal surface of the wafer) in an initial (normal) state before applying an external force. For example, as shown in FIG. 3, compression springs 17 are provided on a side closer to a printed board 16 to be described later, that is, on an opposite side closer to a wafer 18, and the probe needles 13 are biased upward (pulled up) so as not to be in contact with pad portions 20 on a test target chips 19 formed on the wafer 18 in the initial state. In FIG. 3, some of the probe needles 13 are omitted from FIG. 1 for simplifying the drawing.

As shown in FIG. 3, in order to support the spring 17, convex locking parts 14-1 and 14-2 are formed on upper and lower ends of the barrel 14 on a surface that is inserted into the spring 17. The locking part 14-2 on the lower end is engaged with an end of the through hole 12 on the wafer side and the spring 17 is disposed between the locking part 14-1 on the upper end and the probe unit 10. Here, the spring 17 may be a tension spring to be disposed between the locking part 14-2 on the lower end and the probe unit 10.

Figure 4:
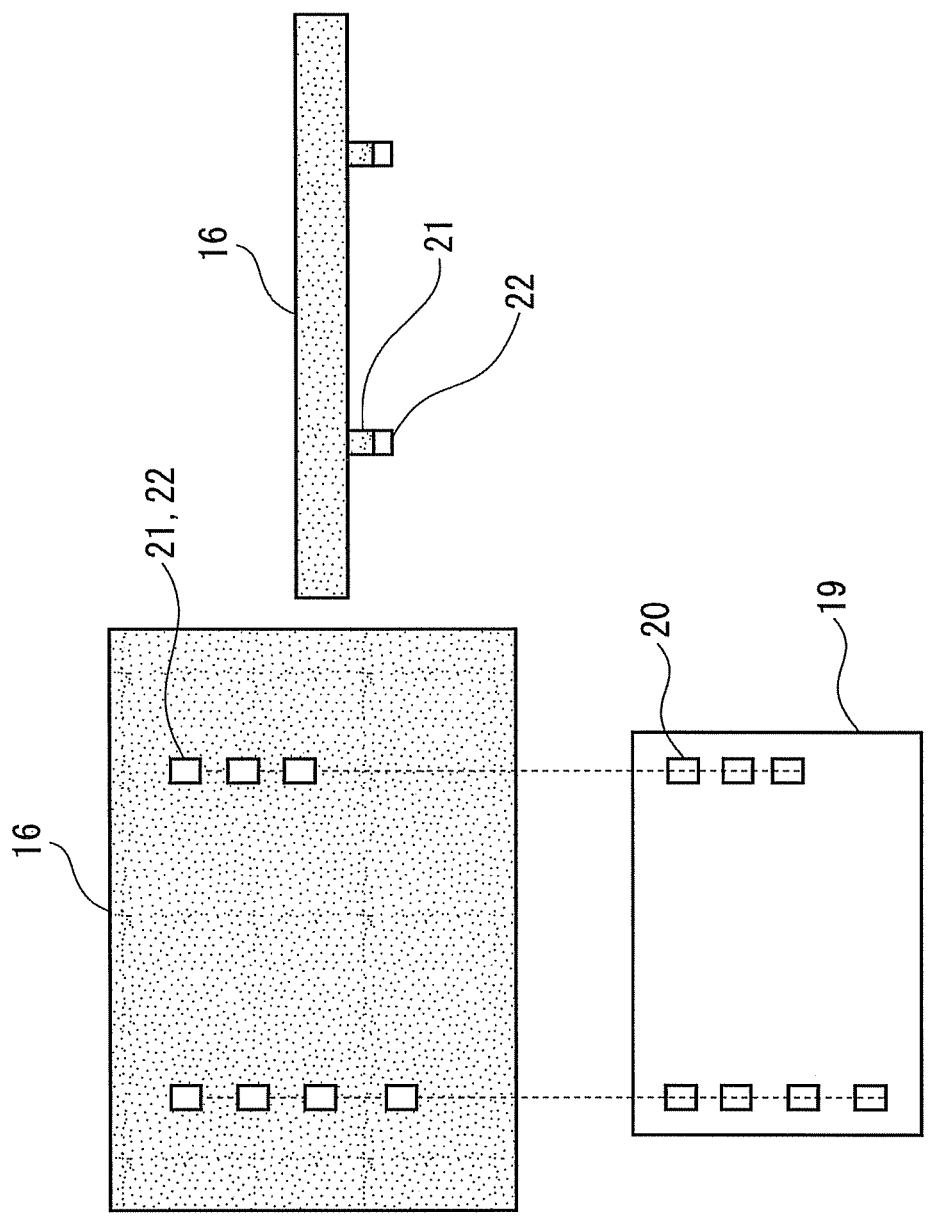
FIG. 4 is a combination of a plan view and a cross-sectional view of a printed board according to the first embodiment of the present invention.

Next, the printed board 16 is processed as shown in FIG. 4. FIG. 4 partially illustrates a region of the printed board 16 corresponding to a single test target chip 19. The printed board 16 is processed so as to have its footprint portions formed in a convex shape, the portions corresponding to the pad portions 20 of the test target chip 19. Each board convex portion 21 may be formed to have such a size, for example, 150 μm in diameter and about 600 μm in height. Here, the test target chip 19 is assumed to have a BIST (built-in self test) function which allows a test using a small number of pins.

Plated portions 22 are formed by gold plating on a surface of this board convex portion 21 so as to achieve an electrical connection to the probe needles 13. The printed board 16 has a multilayer structure, and wiring extends from the plated portions 22 on the surface of the board convex portion 21 through the inside of the printed board 16. Signals are taken out of connection terminals formed on an outer peripheral portion of the printed board 16. This structure makes an electrical connection to an external tester possible.

Figure 1:
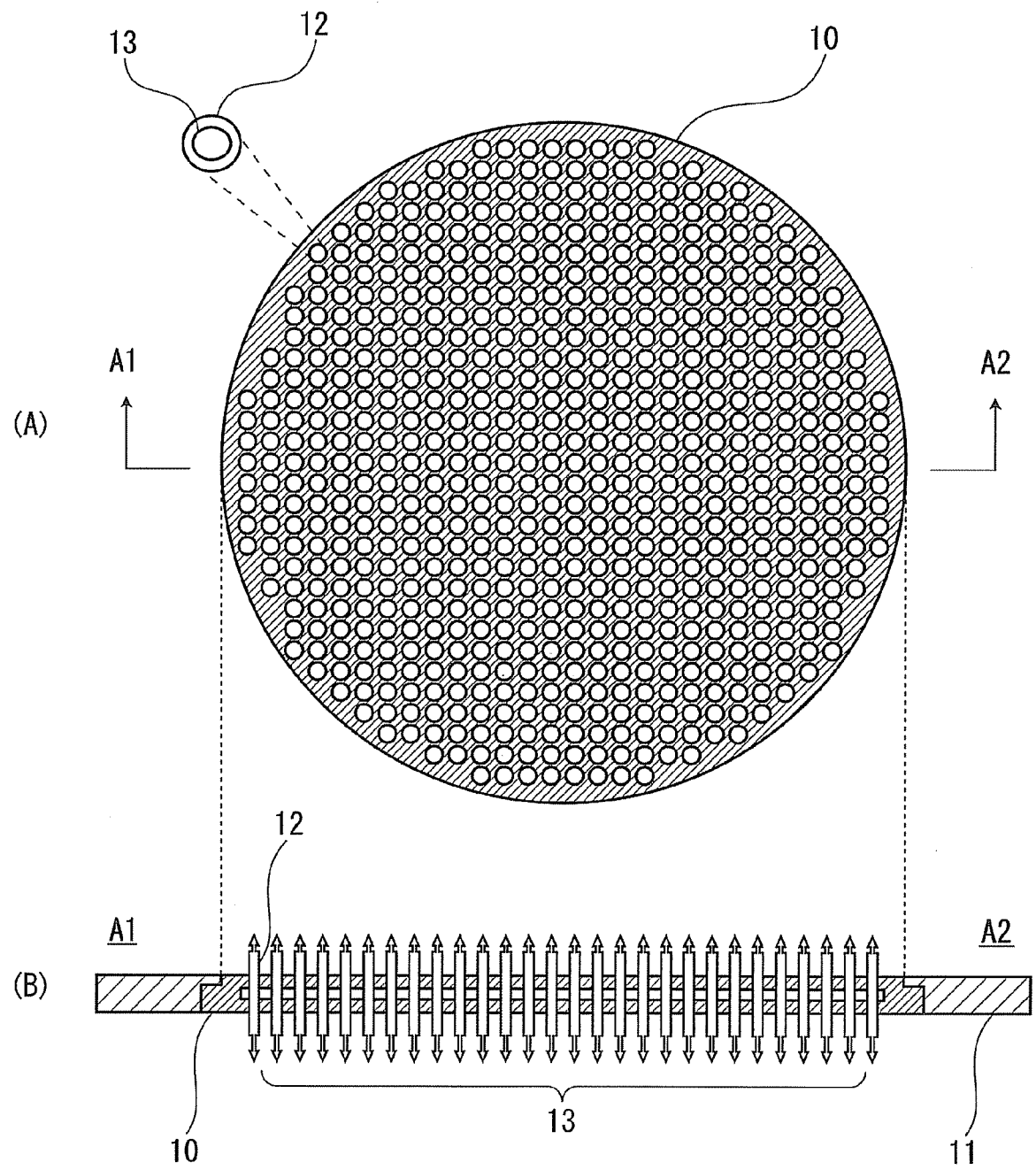
FIG. 1A is a plan view showing a probe unit according to a first embodiment of the present invention and FIG. 1B is a cross-sectional view thereof.
Figure 5:
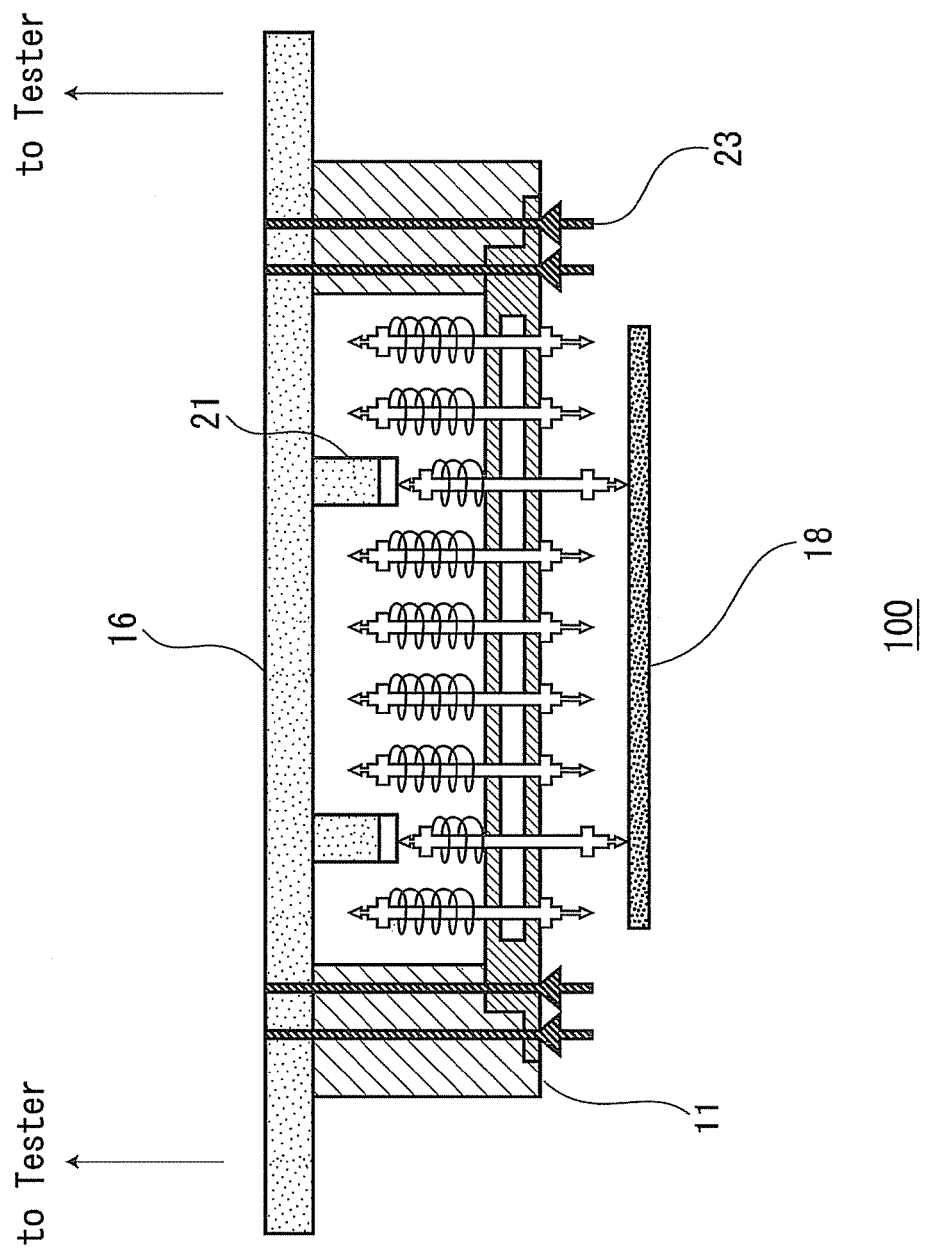
FIG. 5 is another cross-sectional view of the probe unit according to the first embodiment of the present invention.

Next, the probe unit 10 is fixed to the printed board 16 as shown in FIG. 5. FIG. 5 is a cross-sectional view showing a positional relation between the printed boards 16 and the probe needles 13. Although a small number of the probe needles 13 are enlargedly shown herein for simplifying the explanation, a more number of tiny probe needles 13 are disposed actually in a lattice fashion as shown in FIG. 1.

Fixing the printed board 16 to the probe unit 10 provided with the probe needles 13 as shown in FIG. 2 makes it possible to push out only the probe needles 13 in the positions corresponding to the pad portions 20 of the test target chip 19. Therefore, the height of the board convex portion 21 is preferably set so as to allow the probe needle 13 to sufficiently be in contact with the pad portion 20 of the test target chip 19. Fixing screws 23 are used to fix the printed board 16 and the probe unit 10 together through the unit holder 11.

The probe card having the above-described configuration has the numerous through holes provided on the probe unit in advance, and the probe needles respectively inserted into these through holes. In addition, only the probe needles, in the positions corresponding to the pad layout of the test target chip formed on the wafer, are pressed down by use of the convex portions formed on the printed board. Thus an electrical connection is obtained.

Therefore, even when the device to be measured is changed to another one, it is only necessary to develop and fabricate this printed board so that the probe unit, the probe needles, and the unit holder are reusable. Hence, it is possible to significantly reduce a development period and a manufacturing period for the probe card for the different device to be measured. Moreover, it is possible to suppress equipment costs significantly by exchanging the printed board only, and sharing and reusing the housing unit, because the housing unit generally accounts for the majority of costs of the probe card.

Second Embodiment

In this embodiment, the housing having its entire contact area provided with the probe needles 13 is prepared as described in the first embodiment. Here, constituents substantially similar to those in the first embodiment will be denoted by the same reference numerals and duplicated description will be omitted herein.

A probe card 200 according to this embodiment differs from the first embodiment in that the mechanism for pulling the probe needles 13 upward is not provided therein. In this embodiment, a mask made of an insulating material, which is called a contact mask 24, is fabricated in order to avoid probe needles 13, not used at the time of a measurement, from being in contact with the device to be measured.

Figure 6:
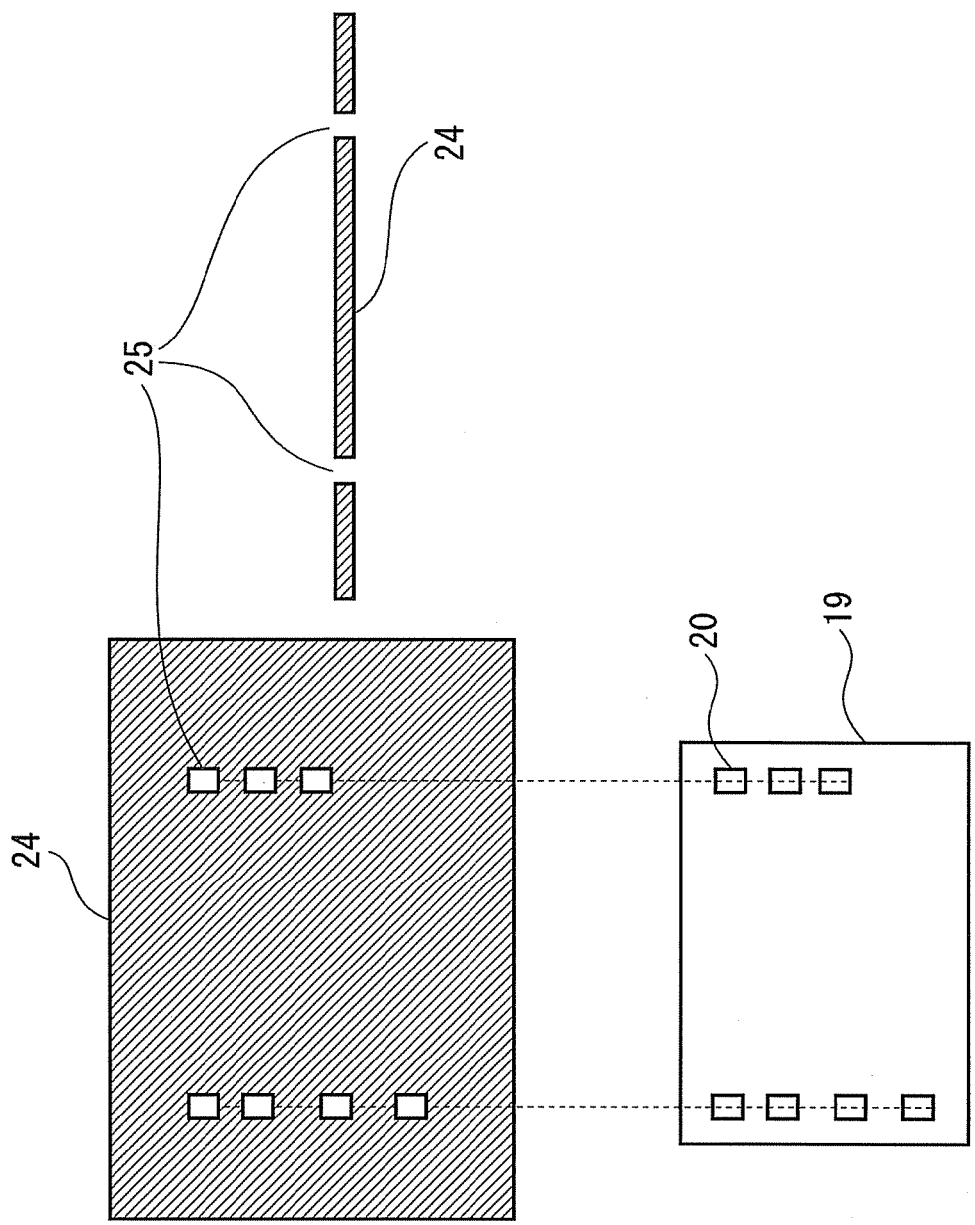
FIG. 6 is a combination of a plan view and a cross-sectional view of a contact mask according to a second embodiment of the present invention.
Figure 7:
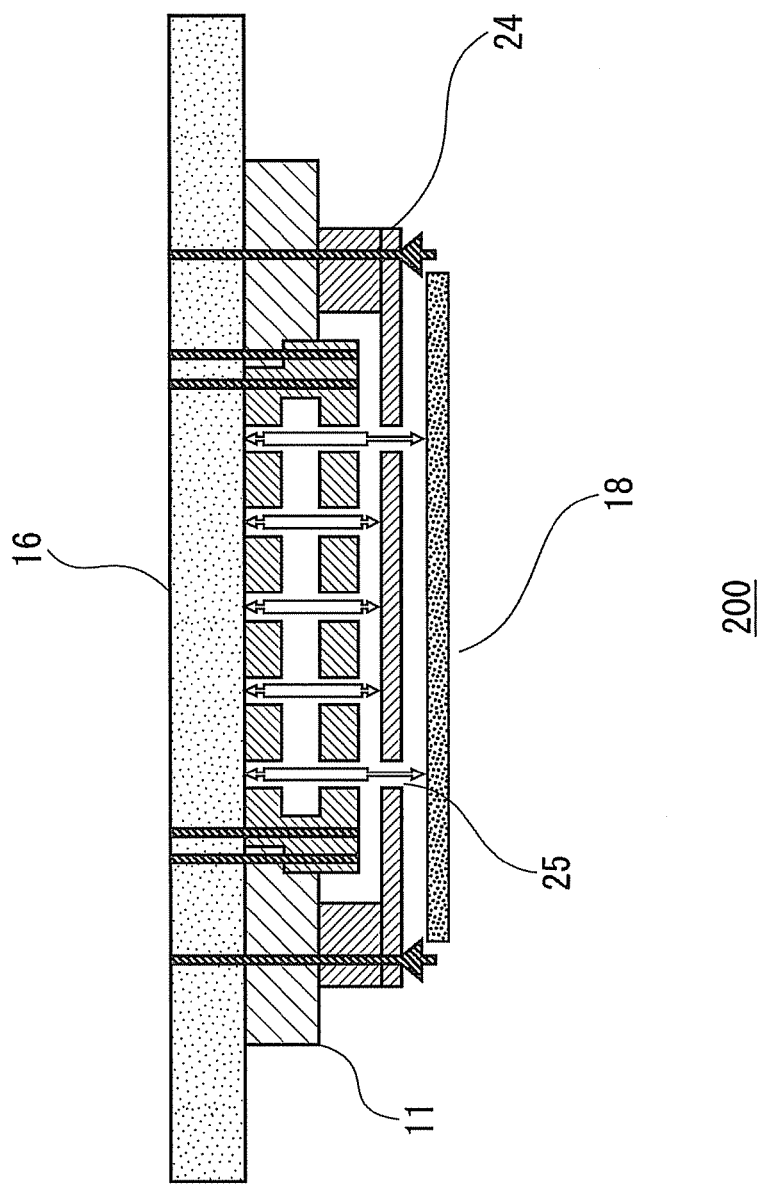
FIG. 7 is a cross-sectional view of a probe unit according to the second embodiment of the present invention.

FIG. 6 partially illustrates a region of the contact mask 24 corresponding to a single test target chip 19. As shown in FIG. 6, portions corresponding to the pad portions of the test target chip 19 are bored in advance. Mask apertures 25 may have the same size as the pad portions 20 as shown in FIG. 6 or may be formed larger or smaller than the pad portions 20. Meanwhile, the mask apertures 25 may be in a square, a rectangular, a circular, an ellipsoidal shape or the like. That is, the contact mask 24 only needs to have the structure where only the probe needles located in the positions necessary for a measurement can be in contact with the pad portions 20, and the rest of the probe needles 13 is not in contact with the pad portions 20.

This contact mask 24 is attached to a contact surface side with the wafer 18 so as to allow only the necessary probe needles 13 to protrude from the mask apertures 25, and so as to cover the unnecessary probe needles 13 in order to avoid the unnecessary probe needles 13 to be in contact with the pad portions 20 of the test target chip 19. Therefore, the contact mask 24 is preferably designed to be in a thickness, which is appropriate to allow the probe needles 13 in the positions corresponding to the mask apertures 25 to protrude at least from a bottom surface of the contact mask 24.

In this way, even when the device to be measured is changed to another one, it is only necessary to develop the printed board and the contact mask so that the housing unit is reusable. Therefore, as similar to the first embodiment, it is possible to significantly reduce the development period and the manufacturing period for the probe card for the different device to be measured. Moreover it is possible to suppress equipment costs significantly by exchanging only the printed board and sharing and reusing the housing unit because the housing unit generally accounts for the majority of costs of the probe card.

Third Embodiment

The first embodiment and the second embodiment have been described based on the case where the probe unit 10 is provided with the through holes 12 laid out in the square lattice. Here, it is also conceivable to fabricate several types of housing units having apertures with different dimensional pitches considering that pad pitches of the measured device have a unique dimension.

In this embodiment, description is given of a method for dealing flexibly with various types of products. In this method, software for calculating a position is utilized to obtain a probe unit number suitable for the necessary aperture position on the basis of dimension information, such as a chip size, a pad position, or the like, of a device to be measured. Then, only a necessary probe needle is planted (press-fitted) in accordance with the obtained probe unit number.

This embodiment describes a process flow of the software configured to select the optimum probe card for testing the device to be measured in accordance with a sequential calculation method. In the following description and drawings, a through hole may be indicated as TH for the purpose of simplification.

Needle position information (information of through hole center position) for each of the probe card is registered in the software in advance. When a probe card is newly fabricated, the software may be updated to deal with the new probe card. The software selects the optimum probe card by comparing this needle position information registered in advance with the pad information on the measured device.

Figure 8A:
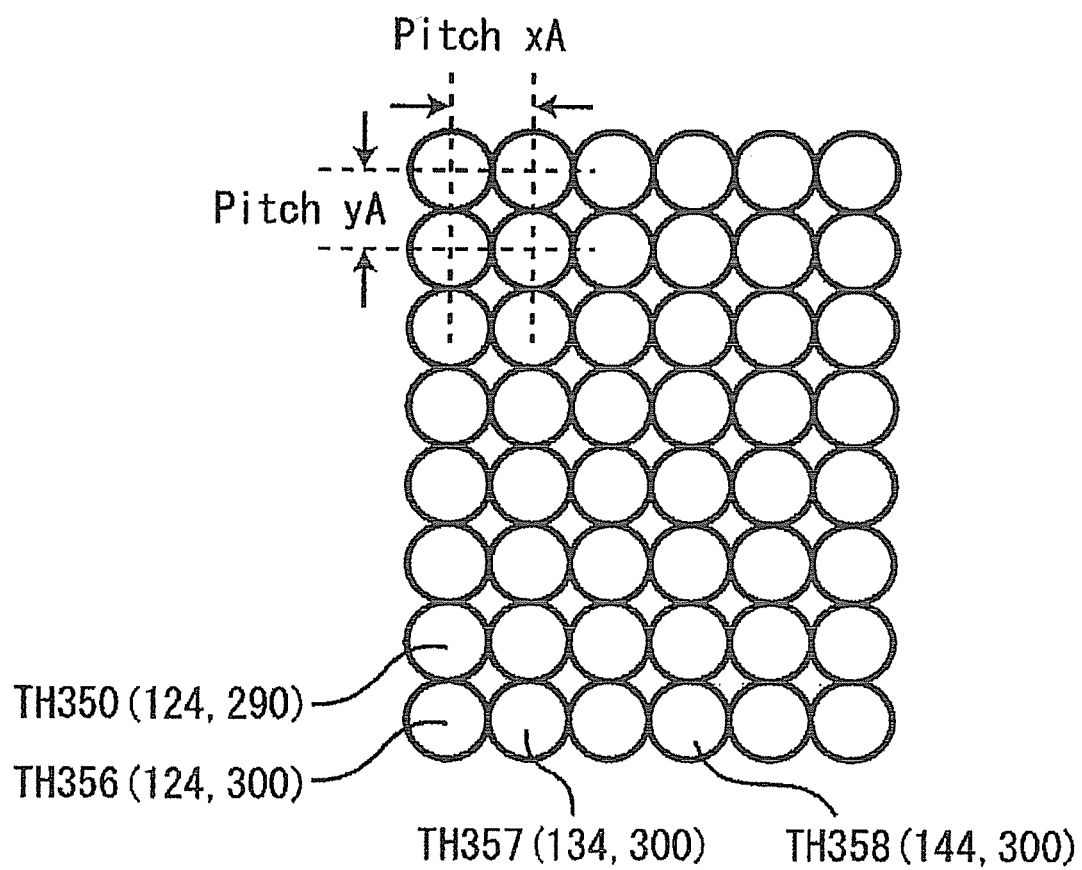
FIGS. 8A to 8G are plan views showing layouts of through holes of a probe unit according to a third embodiment of the present invention.

FIGS. 8A to 8G show variations of through hole layouts. FIG. 8A shows a case of arranging centers of the through holes at positions corresponding to vertices of a square lattice (a first layout) as similar to the first embodiment. Here, mutually adjacent through holes are formed at a minimum processing pitch. In the drawing, the adjacent through holes are in contact with each other for simplifying the description. However, it is needless to say that the through holes are actually separated from each other in an amount equivalent to a processing margin. In the first layout, the though holes are arranged with an interval Pitch_xA in an x direction, and with an interval Pitch_yA (=Pitch_xA) in a y direction.

Figure 8B:
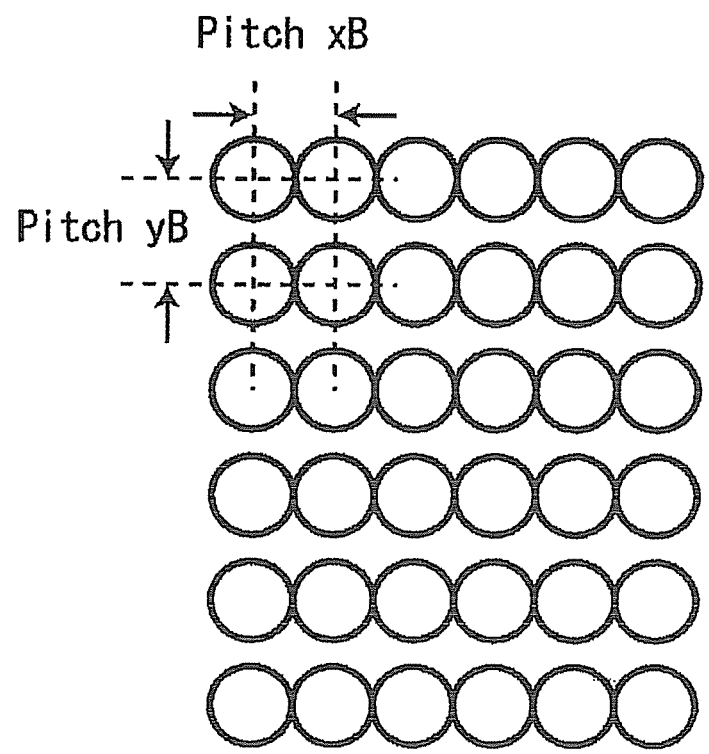

FIG. 8B shows a case of arranging the centers of the through holes at positions corresponding to vertices of a rectangular lattice (a second layout). In the second layout, the though holes are arranged with an interval Pitch_xB in the x direction and with an interval Pitch_yB in the y direction. The interval Pitch_xB is equal to the minimum processing pitch Pitch_xAe. The interval Pitch_yB is wider than the minimum processing pitch Pitch_yA.

Figure 8C:
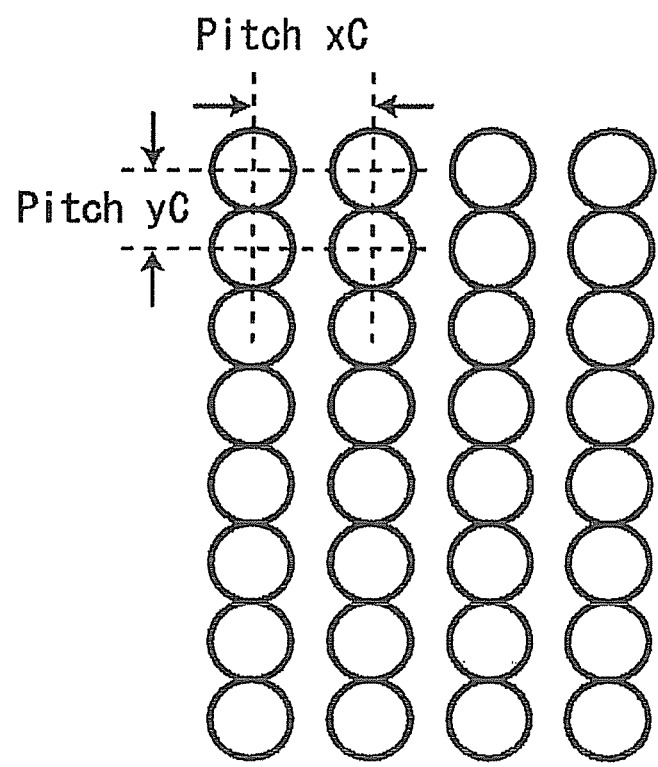

FIG. 8C shows a case of arranging the centers of the through holes at positions corresponding to vertices of a rectangular lattice (a third layout) as similar to FIG. 8B. In the third layout, the though holes are arranged with an interval Pitch_xC in the x direction and with an interval Pitch_yC in the y direction. The interval Pitch_xC is wider than the minimum processing pitch Pitch_xA. The interval Pitch_yC is equal to the minimum processing pitch Pitch_yA.

Figure 8D:
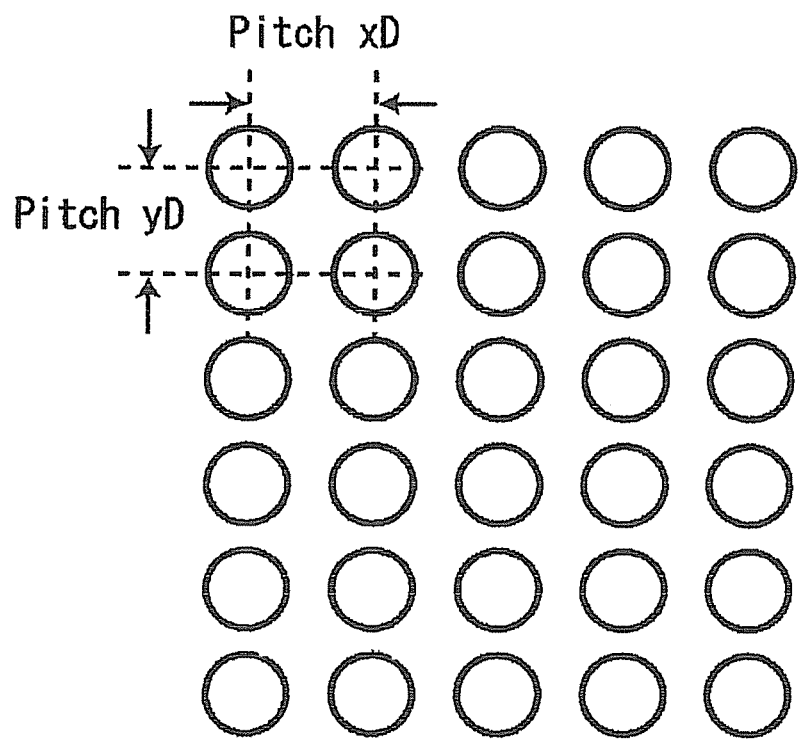

FIG. 8D shows a case of arranging the centers of the through holes at positions corresponding to vertices of a square lattice (a fourth layout) as similar to FIG. 8A. In the fourth layout, the though holes are arranged with an interval Pitch_xD in the x direction and with an interval Pitch_yD in the y direction. The interval Pitch_xD is wider than the minimum processing pitch Pitch_xA. The interval Pitch_yD is wider than the minimum processing pitch Pitch_yA.

Figure 8E:
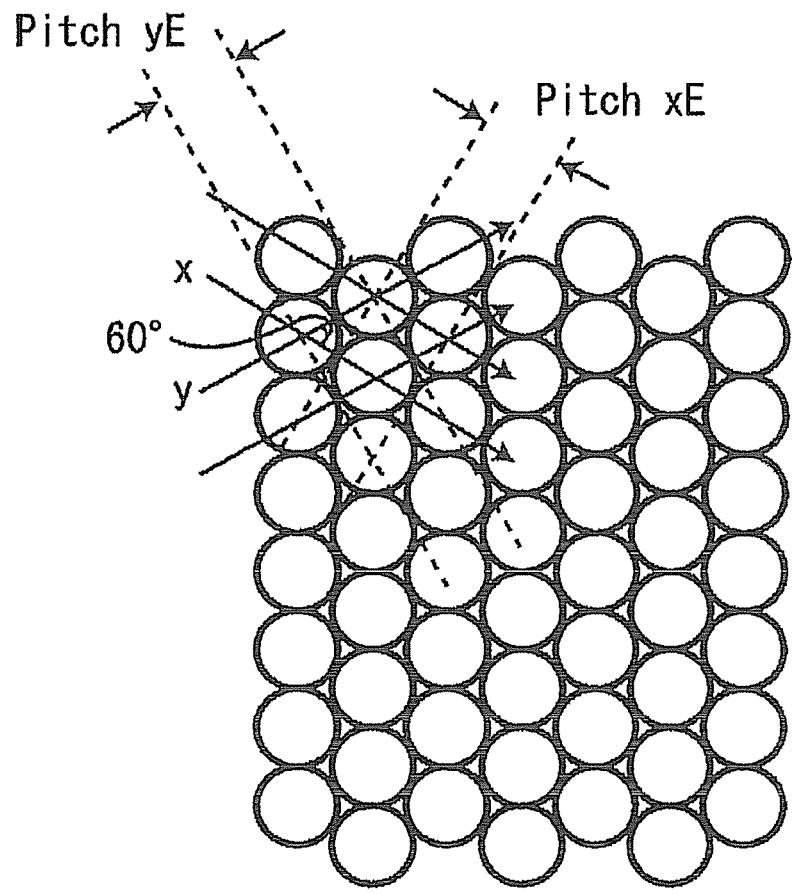

FIG. 8E shows a case of arranging the centers of the through holes at positions corresponding to vertices of a hexagonal lattice (a fifth layout). Here, the mutually adjacent through holes are formed at the minimum processing pitch. In the drawing, the adjacent through holes are in contact with each other. However, the through holes are actually separated from each other in the amount equivalent to the processing margin. The fifth layout is an example of the layout having the highest through hole density.

In FIG. 8E, the x direction and the y direction makes an angle equal to 60°, and the though holes are arranged with an interval Pitch_xE in the x direction and with an interval Pitch_yE in the y direction. The interval Pitch_xE is equal to the minimum processing pitch Pitch_xA. The interval Pitch_yE is equal to the minimum processing pitch Pitch_yA.

Figure 8F:
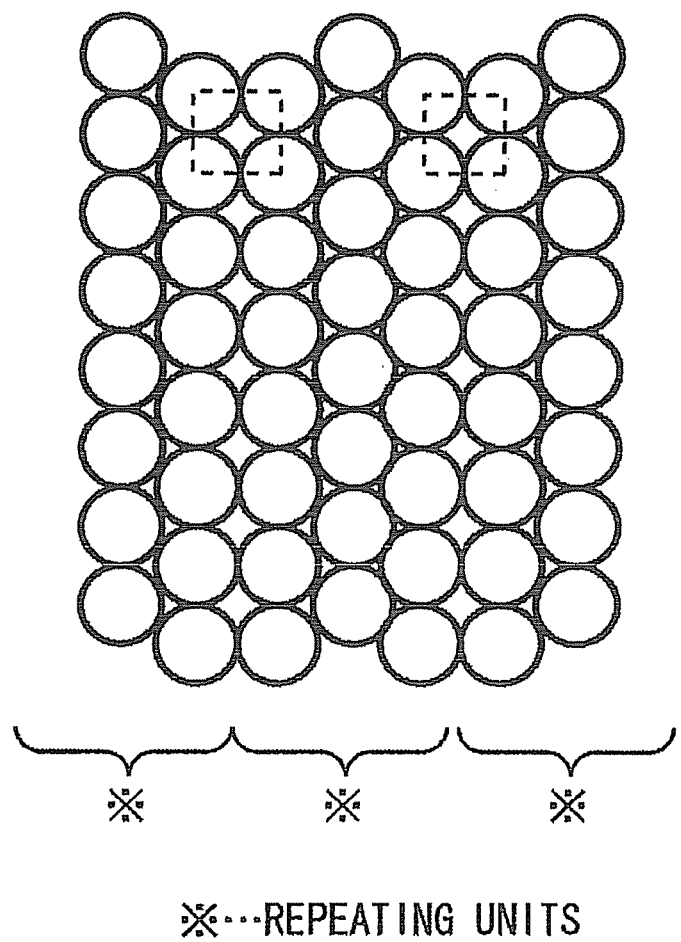

FIG. 8F shows a case of cyclically arranging the hexagonal lattice shown in FIG. 8E in accordance with a predetermined rule (a sixth layout). Mutually adjacent repeating units (*) are arranged such that the adjacent through holes in the adjacent units collectively form the square lattice.

Figure 8G:
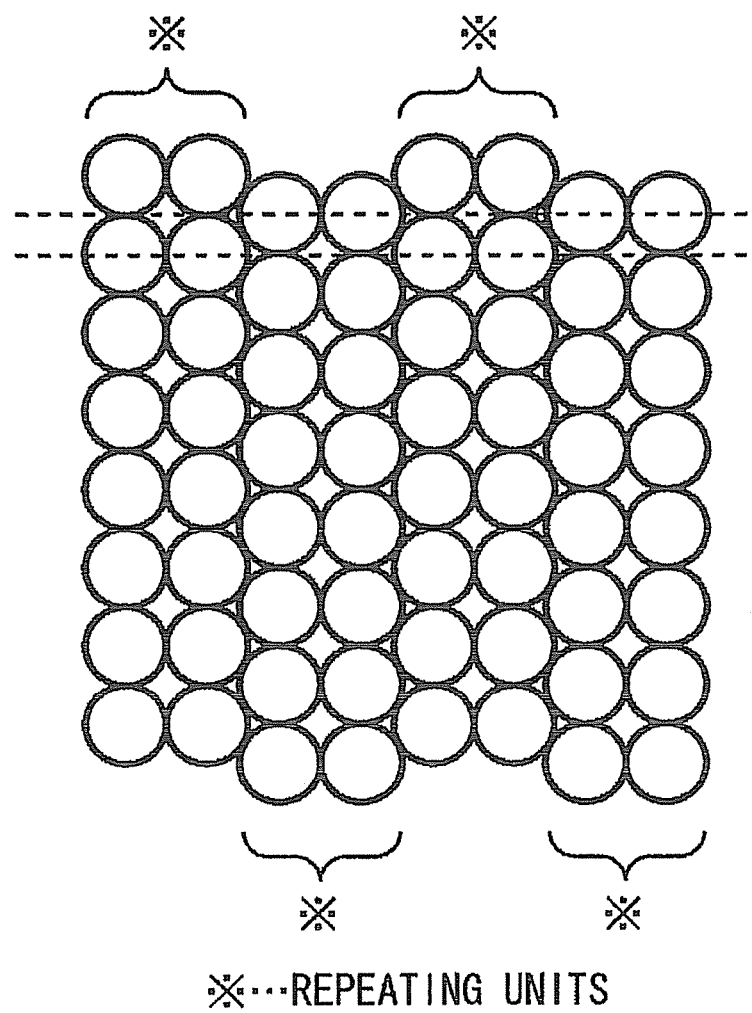

FIG. 8G shows a case of cyclically arranging the square lattice shown in FIG. 8A in accordance with a predetermined rule (a seventh layout). Mutually adjacent repeating units (*) are arranged so as to be displaced from each other by an amount equivalent to Pitch_yA/2 in the y direction.

The through hole layout patterns shown in FIG. 8A to FIG. 8G are merely examples and other variations are also conceivable. The number of the probe cards to be fabricated may be determined appropriately in consideration of pad layout tendencies and other features of a group of products to be tested.

In this embodiment, x coordinates and y coordinates (x, y) of the through holes TH of all the probe cards are registered in advance. Alternatively, pad pitches or layout cycles may be registered instead of the coordinates. Here, the coordinates of the through holes indicate the coordinates of center positions of the through holes.

Figure 9:
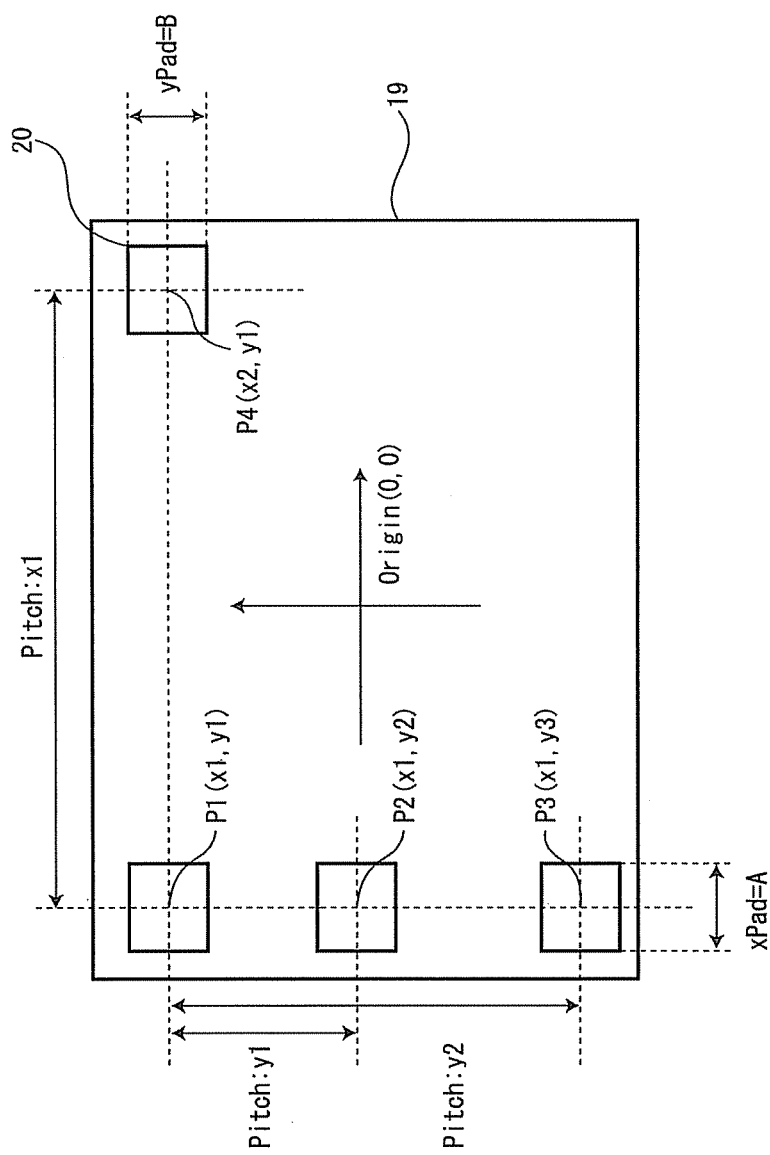
FIG. 9 is a plan view of a device which the probe unit according to the third embodiment of the present invention measures.

FIG. 9 is a schematic diagram showing information concerning pad positions of the test target chip 19. In this embodiment, the information necessary for selecting the optimum probe card for the test target chip 19 includes pad coordinates, pad sizes, and the number of the pads, for example. The pad coordinates may be calculated by defining a center position of the test target chip 19 as the point of origin, for example.

The example in FIG. 9 shows the test target chip including four pad portions. Here, positions of the respective pads are assumed to be P1 (x1, y1), P2 (x1, y2), P3 (x1, y3), and P4 (x2, y1) (x1<x2, and y1<y2<y3). Meanwhile, an interval (a pitch) between the P4 and P1 is set to x1, an interval (a pitch) between the P2 and P1 is set to y1, and an interval (a pitch) between the P3 and P1 is set to y2. Further, a pad size xPad in the x direction is set to A, while a pad size yPad in the y direction is set to B.

Figure 10:
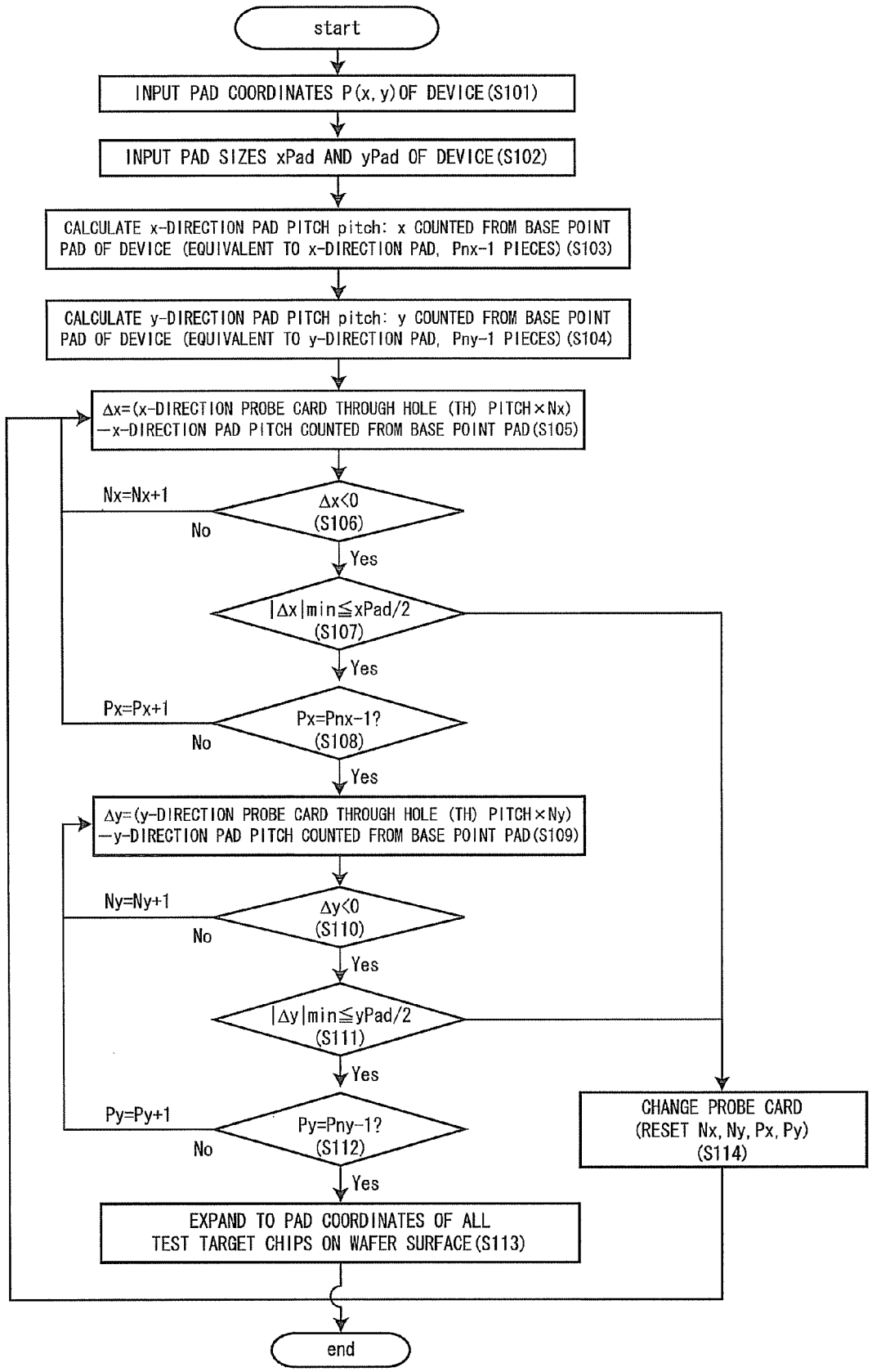
FIG. 10 is a flowchart showing a method for selecting a probe card according to the third embodiment of the present invention.
Figure 12:
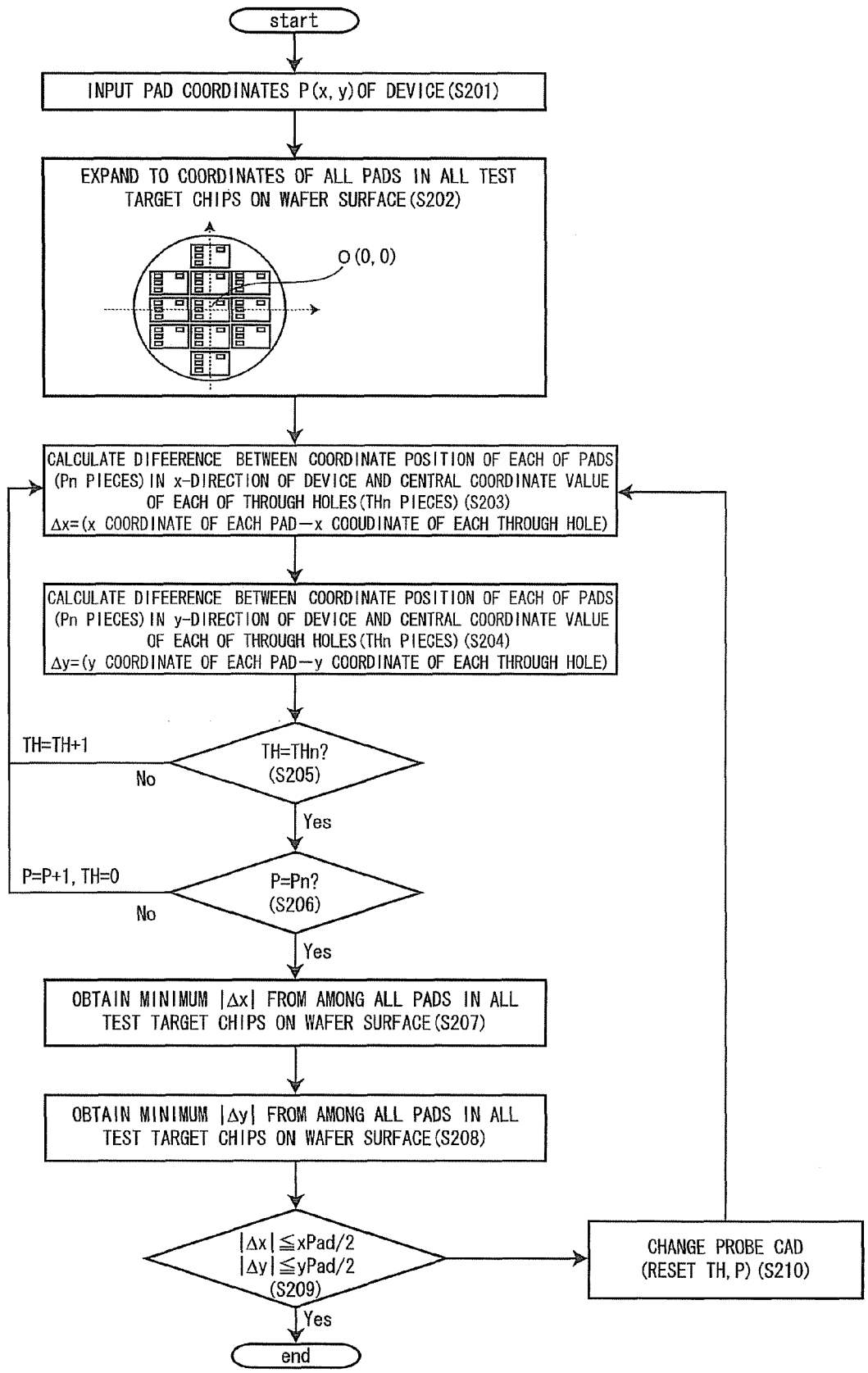
FIG. 12 is a flowchart showing a method for selecting a probe card according to a fourth embodiment of the present invention.

The description will be given, with reference to FIG. 10 of the method for selecting the optimum probe card for the pad layout of the test target chip from among all the above probe cards. FIG. 10 is a flowchart showing the method for selecting a probe card of this embodiment.

First, pad coordinates P (x, y) of the test target chip 19 necessary for testing are inputted. Taking the test target chip 19 shown in FIG. 9 as an example, the coordinates of P1, P2, P3, and P4 may be inputted (Step S101).

Next, the pad sizes of the test target chip 19 are inputted. Taking the test target chip 19 shown in FIG. 9 as an example, xPad=A and yPad=B may be inputted (Step S102).

Next, the number of pad pitches in the x direction counted from a base point pad of the test target chip 19 is calculated. Assuming that the number of pads in the x direction is Pnx, it is necessary to calculate the number of pad pitches equivalent to (Pnx−1) pieces. Taking the test target chip 19 shown in FIG.

9 as an example, Pnx=2 holds true. Accordingly, the pitch x1 (that is, P4 (x2, y2)–P1 (x1, y1)) may be calculated (Step S103).

Next, the number of pad pitches in the y direction counted from the base point pad of the test target chip 19 is calculated. Assuming that the number of pads in the y direction is Pny, it is necessary to calculate the number of pad pitches equivalent to (Pny−1) pieces. Taking the test target chip 19 shown in FIG. 9 as an example, Pny=3 holds true. Accordingly, the pitch y1 (that is, P2 (x1, y2)–P1 (x1, y1)) and the pitch y2 (that is, P3 (x1, y3)–P1 (x1, y1)) may be calculated (Step S104).

In Step S103 and Step S104, any pad on the test target chip 19 may be selected as the base point pad.

Next, an x-direction pitch difference dx, (the through hole pitch of the currently selected probe card×Nx)−(the number of the x-direction pad pitches counted from the base point pad), is calculated (Step S105). Here, Nx is a positive integer and has an initial value set to Nx=1.

Next, a judgment is made as to whether or not the x-direction pitch difference dx is below 0 (Step S106). When the x-direction pitch difference dx is equal to or above 0 (No in Step S106), Nx is incremented and then the calculation in Step S105 is executed again.

On the other hand, when the x-direction pitch difference dx is below 0 (Yes in Step S106), a judgment is made as to whether or not a minimum value of an absolute value of the x-direction pitch difference dx obtained by a calculation based on the Nx value is not more than xPad/2 (Step S107). Assuming that the Nx value when dx is negative is defined as Nx', it is only necessary to judge whether or not the absolute value of either one of the x-direction pitch difference dx in the case of Nx=Nx' and the x-direction pitch difference dx in the case of Nx=Nx'−1) is not more than xPad/2.

Next, when the minimum value of the absolute value of the x-direction pitch difference dx is judged to be not more than xPad/2 (Yes in Step S107), a judgment is made as to whether or not the pad currently being calculated is the last pad in the x direction (that is, whether or not Px=Pnx−1) (Step S108). When the pad currently being calculated is not the last pad in the x direction (No in Step S108), Px is incremented and then the calculation in Step S105 is executed again.

On the other hand, when the pad currently being calculated is the last pad in the x direction (Yes in Step S108), a y-direction pitch difference dy, (the through hole pitch of the currently selected probe card×Ny)−(the number of the y-direction pad pitches from the base point pad), is calculated (Step S109). Here, Ny is a positive integer and an initial value is set to Ny=1.

Next, a judgment is made as to whether or not the y-direction pitch difference dy is below 0 (Step S110). When the y-direction pitch difference dy is equal to or above 0 (No in Step S110), Ny is incremented and then the calculation in Step S109 is executed again.

On the other hand, when the y-direction pitch difference dy is below 0 (Yes in Step S110), a judgment is made as to whether or not a minimum value of an absolute value of the y-direction pitch difference dy obtained by a calculation based on the Ny value is not more than yPad/2 (Step S111). Assuming that the Ny value when dy is negative is defined as Ny', it is only necessary to judge whether or not the absolute value of any one of the y-direction pitch difference dy in the case of Ny=Ny' and the y-direction pitch difference dy in the case of Ny=(Ny'−1) is not more than yPad/2.

Next, when the minimum value of the absolute value of the y-direction pitch difference dy is judged to be not more than yPad/2 (Yes in Step S111), a judgment is made as to whether or not the pad currently being calculated is the last pad in the y direction (that is, whether or not Py=Pny−1) (Step S112).

When the pad currently being calculated is not the last pad in the y direction (No in Step S112), Py is incremented and then the calculation in Step S109 is executed again.

On the other hand, when the pad currently being calculated is the last pad in the y direction (Yes in Step S112), the pad coordinates of all the chips located on the wafer surface are calculated using as standards the positions, where the probe needles are press-fitted, of the test target chip 19 currently being calculated (Step S113). Specifically, the above-described steps are sequentially repeated for all the chips located on the wafer surface.

Meanwhile, if the minimum value of the absolute value of the x-direction pitch difference dx is judged to be larger than xPad/2 in Step S107 or if the minimum value of the absolute value of the y-direction pitch difference dy is judged to be larger than yPad/2 in Step S111, the result means that the currently selected probe card is not the optimum one. Accordingly, a different probe card is selected from the probe cards registered in advance and the calculation in Step S105 is executed again (Step S114).

FIGS. 11A and 11B explain a concrete example in the case of calculating the x-direction pitch difference and the y-direction pitch difference. Here, a calculation example is shown using the probe card having the first layout shown in FIG. 8A. First, the method of calculation in the x-direction will be described with reference to FIG. 11A.

The case shown in FIG. 11A satisfies the condition of Step S106 when Nx=11, for example. Moreover, the x-direction pitch difference dx is not more than xPad/2 when Nx=11. Hence the condition in S107 is also satisfied. Therefore, it is apparent that the probe card does not have to be changed to the new one, at least in terms of the x direction, for testing the test target chip 19 that is currently targeted.

In the case shown in FIG. 11B, the first pad (Py=2) counted in the y direction from the base point pad satisfies the condition of Step S110 when Ny=4, for example. Moreover, the y-direction pitch difference dy is not more than yPad/2 when Ny=3. Hence the condition in S111 is also satisfied.

Further, the second pad (Py=3) counted in the y direction from the base point pad satisfies the condition of Step S110 when Ny=8, for example. Moreover, the y-direction pitch difference dy is not more than yPad/2 when Ny=7. Hence the condition in S111 is also satisfied. Therefore, it is apparent that the probe card does not have to be changed to the new one, at least in terms of the y direction, for testing the test target chip 19 that is currently targeted.

In this embodiment, the calculation is sequentially repeated for all the chips located on the wafer surface based on the above-described process flow. In this way, it is possible to efficiently select the optimum probe cards for the devices to be measured.

Fourth Embodiment

In this embodiment, as similar to the third embodiment, description is given of a method for dealing with various types of products. In this method, software for calculating a position is utilized to obtain a probe unit number suitable for the necessary aperture position on the basis of dimension information, such as a chip size, pad position or the like, of a device to be measured. Then, only a necessary probe needle is planted (press-fitted) in accordance with the obtained probe unit number.

This embodiment describes a process flow of the software configured to select the optimum probe card for testing the device to be measured in accordance with a method for collectively calculating an entire-surface.

First, the pad coordinates P (x, y) of the test target chip 19 necessary for testing are inputted. For example, in the case of the test target chip 19 shown in FIG. 9, the coordinates of P1, P2, P3, and P4 may be inputted (Step S201).

Next, the pad coordinates P (x, y) of the test target chip 19 are expanded to the coordinates of all the pads in all the test target chips located on the wafer surface (the center position of the wafer may be defined as the point of origin, for example). Here, the coordinates of all the pads in all the test target chips located on the wafer surface are obtained based on information including the size of the test target chips, the interval between the adjacent test target chips and the like. Alternatively, it is also possible to directly input the pad coordinates (x, y) of all the test target chips 19 located on the wafer surface (Step S202).

Next, a difference dx between an x coordinate of a P-th pad on the wafer surface and an x coordinate of a TH-th through hole on the wafer surface is calculated. Here, dx=(the x coordinate of the P-th pad)−(the x coordinate of the TH-th through hole). Initial values of P and TH are set to 0 and values of the center positions of the pad portion and of the through hole are used for each of the coordinates (Step S203).

Next, a difference dy between a y coordinate of the P-th pad on the wafer surface and a y coordinate of the TH-th through hole on the wafer surface is calculated. Here, dy=(the y coordinate of the P-th pad)−(the y coordinate of the TH-th through hole) (Step S204).

Next, a judgment is made as to whether or not the through hole TH currently being calculated is the last through hole THn in the probe card (that is, whether or not TH=THn) (Step S205). When the through hole currently being calculated is judged not to be the last through hole in the probe card in Step S205, the through hole number is incremented and then the calculation in Step S203 is executed again.

On the other hand, when the through hole currently being calculated is judged to be the last through hole in the probe card in Step S205, a judgment is made whether or not the pad P currently being calculated is the last pad Pn on the wafer surface (that is, whether or not P=Pn) (Step S206).

When the pad currently being calculated is judged to be the last pad on the wafer surface, dx of the minimum absolute value (dxmin) are obtained from among all the pads in all the test target chips located on the wafer surface (Step S207).

Next, dy of the minimum absolute value (dymin) is obtained from among all the pads in all the test target chips located on the wafer surface (Step S208). The through holes that provide the values of dxmin and dymin indicate the positions of the through holes corresponding to the pads targeted for measurement in Step S207 and Step S208.

Next, a judgment is made whether or not the following inequalities hold true: dxmin obtained in Step S207 corresponding to each of the pads is equal to or below xPad/2; dymin obtained in Step S208 corresponding thereto is equal to or below yPad/2 (Step S209).

When dxmin is judged to be more than xPad/2 or when dymin is judged to be more than yPad/2 in Step S209, the result means that the currently selected probe card is not the optimum one. Accordingly, a different probe card is selected from the probe cards registered in advance and the calculation in Step S203 is executed again.

On the other hand, when dxmin is judged to be not more than xPad/2 and dymin is judged to be not more than yPad/2 in Step S209, the result means that the currently selected probe card can be used for testing the test target chips located on the wafer surface. Therefore, the process is terminated.

In this embodiment, it is possible to efficiently select the optimum probe card for the device to be measured by collectively executing the calculation for all the pads located on the wafer surface based on the above-described process flow.

The present invention has been described above with reference to the first embodiment and the second embodiment. However, the present invention is not limited only to the embodiments described above, but may be combined with other modified example as appropriate, or may be modified in various ways in a practical phase without departing from the scope of the invention. In addition, the above-described embodiments include various phases of the invention, and thus various aspects of the invention can be extracted by appropriately combining multiple constituents of those disclosed herein. For example, even if one or more constituents are deleted from all the constituents disclosed in the embodiments, such a configuration after deletion of the one or more constituents can also be extracted as an aspect of the present invention as far as it is possible to solve at least one of the problems stated in the summary of the invention and to obtain at least one of the effects of the invention stated therein.

The invention claimed is:

1. A probe card comprising:
a probe unit having a plurality of through holes arranged therein;
a plurality of probe needles respectively press-fitted to the plurality of through holes;
a printed board having a plurality of convex portions located in a predetermined position which presses down any of the plurality of probe needles;
a unit holder which supports the probe unit and the printed board, wherein one part of the plurality of probe needles is connected to the printed board via the plurality of convex portions and is connectable to a test target chip, and another part of the plurality of probe needles is not connected to the printed board and is not connectable to the test target chip, and
a height of the plurality of convex portions is sufficient to the extent that the one part of the plurality of probe needles is connectable to the test target chip.

2. The probe card according to claim 1, wherein a plated portion is formed on a surface of the convex portion so as to be electrically connectable to any of the plurality of probe needles.

3. The probe card according to claim 1, further comprising:
holding means for pulling up the plurality of probe needles in a direction toward the printed board and for then holding the probe needles.

4. The probe card according to claim 3, wherein the holding means includes:
a plurality of convex locking parts, each convex locking part being provided on an end of a corresponding one of the plurality of probe needles on a side closer to the printed board, and a plurality of compression springs, each having an upper end being in contact with each corresponding convex locking part and a lower and being in contact with an upper surface of the probe unit, and the plurality of probe needles are inserted respectively to each compression spring and biased in the direction toward the printed board by each corresponding spring.

5. The probe card according to claim 1, wherein the plurality of through holes are arranged at positions corresponding to vertices of anyone of a square lattice, a rectangular lattice, and a hexagonal lattice.

6. A probe card comprising:
a probe unit having a plurality of through holes arranged therein;
a plurality of probe needles respectively press-fitted to the plurality of through holes;
a printed board electrically connected to the plurality of probe needles; and a contact mask having a plurality of apertures located in a predetermined position through which some of the probe plurality of needles pass, wherein at least one probe needle of the plurality of probe needles is blocked by the contact mask and is not connectable to a test target chip, and at least one other of the plurality of probe needles passes through the plurality of apertures provided in the contact mask and is connectable to the test target chip.

7. The probe card according to claim 6, wherein a tip end of the plurality of probe needles corresponding to the plurality of apertures protrudes at least from a lower surface of the contact mask.

8. The probe card according to claim 6, wherein the contact mask is made of an insulator.

9. The probe card according to claim 6, wherein the plurality of through holes are arranged at positions corresponding to vertices of any of a square lattice, a rectangular lattice, and a hexagonal lattice.

* * * * *